United States Patent
Yamaguchi et al.

(10) Patent No.: US 9,859,484 B2
(45) Date of Patent: Jan. 2, 2018

(54) LIGHT EMITTING APPARATUS

(71) Applicant: Sharp Kabushiki Kaisha, Osaka-shi, Osaka (JP)

(72) Inventors: Ippei Yamaguchi, Osaka (JP); Yuhsuke Fujita, Osaka (JP); Masahiro Konishi, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 132 days.

(21) Appl. No.: 14/436,513

(22) PCT Filed: Sep. 25, 2013

(86) PCT No.: PCT/JP2013/075872
§ 371 (c)(1),
(2) Date: Apr. 17, 2015

(87) PCT Pub. No.: WO2014/065068
PCT Pub. Date: May 1, 2014

(65) Prior Publication Data
US 2016/0172564 A1 Jun. 16, 2016

(30) Foreign Application Priority Data
Oct. 24, 2012 (JP) .................. 2012-235169

(51) Int. Cl.
*H01L 33/62* (2010.01)
*H01L 33/64* (2010.01)
(Continued)

(52) U.S. Cl.
CPC ........ *H01L 33/647* (2013.01); *H01L 25/0753* (2013.01); *H01L 33/486* (2013.01);
(Continued)

(58) Field of Classification Search
CPC .... H01L 25/075–25/0756; H01L 33/64; H01L 33/641; H01L 33/647
See application file for complete search history.

(56) References Cited

U.S. PATENT DOCUMENTS 8,889,517 B2 * 11/2014 Bradley, Jr. ............ H01L 33/60
257/98
2007/0252523 A1 11/2007 Maeda et al.
(Continued)

FOREIGN PATENT DOCUMENTS

CN 201167092 Y 12/2008
CN 102163680 A 8/2011
(Continued)

OTHER PUBLICATIONS

Official Communication issued in International Patent Application No. PCT/JP2013/075872, dated Nov. 5, 2013.

*Primary Examiner* — Mariceli Santiago
(74) *Attorney, Agent, or Firm* — Keating & Bennett, LLP

(57) ABSTRACT

A ceramic insulating film (150) having a heat conducting property and a light reflecting property is formed on a front surface of a substrate (100), and a light emitting element (110) is provided on the ceramic insulating film. This makes it possible to improve a heat dissipation characteristic and a light utilization efficiency of a light emitting apparatus (10) having the light emitting element (101) provided on the substrate (110).

5 Claims, 4 Drawing Sheets

(51) Int. Cl.
*H01L 25/075* (2006.01)
*H01L 33/48* (2010.01)
*H01L 33/60* (2010.01)
*H01L 33/54* (2010.01)

(52) U.S. Cl.
CPC .............. *H01L 33/62* (2013.01); *H01L 33/54* (2013.01); *H01L 33/60* (2013.01); *H01L 33/641* (2013.01); *H01L 2224/45144* (2013.01); *H01L 2224/48091* (2013.01); *H01L 2224/48137* (2013.01)

(56) References Cited

U.S. PATENT DOCUMENTS

| | | | |
|---|---|---|---|
| 2010/0103680 A1 | 4/2010 | Oyaizu et al. | |
| 2011/0204398 A1 | 8/2011 | Tanida et al. | |
| 2011/0259564 A1 | 10/2011 | Izutani et al. | |
| 2011/0259565 A1 | 10/2011 | Izutani et al. | |
| 2011/0259566 A1 | 10/2011 | Izutani et al. | |
| 2011/0259567 A1 | 10/2011 | Izutani et al. | |
| 2011/0259568 A1 | 10/2011 | Izutani et al. | |
| 2011/0259569 A1 | 10/2011 | Izutani et al. | |
| 2011/0260185 A1 | 10/2011 | Izutani et al. | |
| 2011/0261242 A1 | 10/2011 | Izutani et al. | |
| 2011/0261535 A1 | 10/2011 | Izutani et al. | |
| 2011/0262728 A1 | 10/2011 | Izutani et al. | |
| 2011/0267557 A1 | 11/2011 | Izutani et al. | |
| 2012/0080713 A1 | 4/2012 | Agatani et al. | |
| 2012/0250310 A1* | 10/2012 | Hussell | H01L 25/0753 362/235 |
| 2013/0037834 A1 | 2/2013 | Happoya et al. | |
| 2013/0193862 A1* | 8/2013 | Sasano | H01L 25/0753 315/192 |
| 2013/0200406 A1* | 8/2013 | Hussell | H01L 33/486 257/88 |

FOREIGN PATENT DOCUMENTS

| | | | |
|---|---|---|---|
| JP | 59-149958 A | | 8/1984 |
| JP | 01-156056 A | | 6/1989 |
| JP | 2002-304902 A | | 10/2002 |
| JP | 2006-066822 A | | 3/2006 |
| JP | 3131092 U | * | 4/2007 |
| JP | 2009-76576 A | | 4/2009 |
| JP | 2010-10469 A | | 1/2010 |
| JP | 2010-135749 A | | 6/2010 |
| JP | 2011-216588 A | | 10/2011 |
| JP | 2011-258866 A | | 12/2011 |
| JP | 2012-039067 A | | 2/2012 |
| JP | 2012-69749 A | | 4/2012 |
| JP | 2012-079855 A | | 4/2012 |
| WO | 2006/019090 A1 | | 2/2006 |

* cited by examiner

LIGHT EMITTING APPARATUS

TECHNICAL FIELD

The present invention relates to a light emitting apparatus including a light emitting element which is provided on a substrate.

BACKGROUND ART

Conventionally, a light emitting apparatus employing a ceramic substrate, a light emitting apparatus having an organic resist layer as an insulating layer on a metal substrate, and the like are known as a light emitting apparatus including a light emitting element which is provided on a substrate.

Patent Literature 1 discloses a technique to form a laminated plate having a tracking resistance by (i) forming a ceramic layer by thermally spraying ceramic on one surface of a copper foil, (ii) applying an adhesive to the ceramic layer, and (iii) stacking a coated fabric, which is made by impregnating a paper base with phenolic resin, on the adhesive-applied surface.

Further, Patent Literature 2 discloses a thermoelectric conversion apparatus employing a metal substrate on which an insulating film layer made of a ceramic paint is formed.

Furthermore, Patent Literature 3 discloses a technique to form an insulating film by applying a ceramic paint to a base such as an aluminum plate.

CITATION LIST

Patent Literatures

Patent Literature 1
Japanese Patent Application Publication Tokukaihei No. 1-156056 (Jun. 19, 1989)
Patent Literature 2
Japanese Patent Application Publication Tokukai No. 2006-66822 (Mar. 9, 2006)
Paten Literature 3
Japanese Patent Application Publication Tokukaisyo No. 59-149958 (Aug. 28, 1984)

SUMMARY OF INVENTION

Technical Problem

In a case where a high-output light emitting apparatus is prepared, it is necessary to improve efficiency of radiating heat which occurs from a light emitting element and the like. In this regard, a ceramic substrate which has been conventionally used is insufficient in heat conducting property, and it is therefore necessary to use a metal substrate having a higher heat conducting property. Further, it is necessary to provide an insulating layer on the metal substrate for forming a wiring pattern on the metal substrate. Furthermore, for improving light utilization efficiency of the light emitting apparatus, the insulating layer needs to have a high heat conducting property and a high light reflecting property.

However, an organic resist, which has conventionally been used as an insulating layer on a substrate of the light emitting apparatus, has a problem that a heat conducting property, a heat resistance, and a light resistance cannot be sufficiently obtained. Further, for improving the light utilization efficiency, it is necessary to reflect light that has leaked to a substrate side via the insulating layer. However, in a conventional configuration employing the organic resist as the insulating layer, a sufficient light reflecting property cannot be obtained.

The present invention is attained in view of the above problems. An object of the present invention is to improve the heat radiation and the light utilization efficiency in a light emitting apparatus including a light emitting element which is provided on a substrate.

Solution to Problem

A light emitting apparatus in accordance with one aspect of the present invention includes: a substrate; a light emitting element disposed on the substrate; and a ceramic insulating film which has been formed by applying a ceramic paint to the substrate and has a heat conducting property and a light reflecting property, the light emitting element being disposed on the ceramic insulating film.

Advantageous Effects of Invention

The above configuration makes it possible to achieve the light emitting apparatus in which the insulating layer excellent in heat conducting property and in light reflecting property is provided on the substrate on which the light emitting element is provided.

DESCRIPTION OF EMBODIMENTS

Embodiment 1

The following discusses Embodiment 1 of the present invention.

Figure 1:
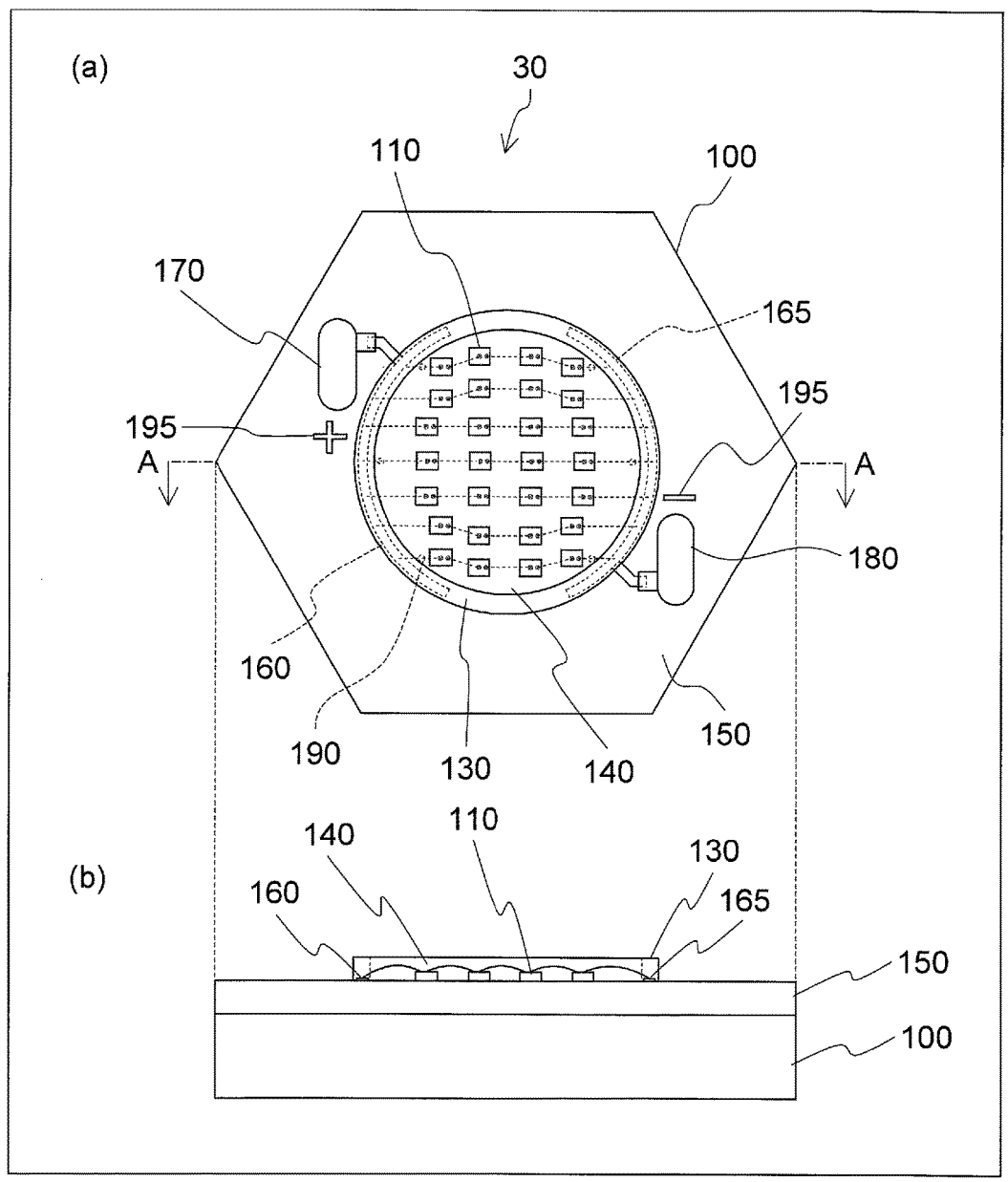
FIG. 1 illustrates a top view and a sectional view of a light emitting apparatus in accordance with Embodiment 1 of the present invention.

(a) of FIG. 1 is a top view illustrating one configuration example of a light emitting apparatus 30 in accordance with Embodiment 1. (b) of FIG. 1 is a cross-sectional view taken from line A-A in (a) of FIG. 1.

As illustrated in FIG. 1, the light emitting apparatus 30 includes a substrate 100, a plurality of light emitting elements (semiconductor light emitting element) 110, a light reflecting resin frame 130, a sealing resin 140, and a ceramic insulating film 150 having a single-layer structure.

The substrate 100 is made of a material having a high heat conducting property. The material of the substrate 100 is not limited to a particular one, provided that the material has the high heat conducting property. For example, it is possible to employ a substrate made of metal such as aluminum or copper. In Embodiment 1, the substrate 100 is made of aluminum because aluminum is low in cost, easy to process, and resistant to ambient humidity. Further, in Embodiment 1, an outer shape of the substrate 100 is a hexagonal shape. However, the outer shape of the substrate 100 is not limited to this and can be, for example, a polygonal shape (such as a triangular shape, a quadrangular shape, a pentagonal shape, or an octagonal shape), a circular shape, an elliptical shape, or the like.

The ceramic insulating film 150 is formed on one side (hereinafter, referred to as "front surface") of the substrate 100 by a printing method, and has an electrical insulating property, a high light reflecting property and a high heat conducting property.

On a front surface of the ceramic insulating film 150, the plurality of light emitting elements 110, the light reflecting resin frame 130, and the sealing resin 140 are provided. Further, on the front surface of the ceramic insulating film 150, a conductor wiring 160 for anode, a conductor wiring 165 for cathode, an anode electrode 170 and a cathode electrode 180 as respective land sections, an alignment mark 190, polarity marks 195, and the like are directly provided.

Note that, on the front surface of the ceramic insulating film 150, a protecting element (not illustrated) connected in parallel with a circuit, to which the plurality of light emitting elements 110 are connected in series, can further be formed as a resistance element to protect the plurality of light emitting elements 110 from an electrostatic stress. For example, the protecting element can be a printed resistor or a zener diode. In a case where the zener diode is employed as the protecting element, the zener diode is die-bonded on a wiring pattern, and is electrically connected to an intended wire by wire bonding. Even in such a case, the zener diode is connected in parallel with the circuit to which the plurality of light emitting elements 110 are connected in series.

Each of the plurality of light emitting elements 110 is a semiconductor light emitting element such as a LED (Light Emitting Diode). In Embodiment 1, a blue light emitting element whose emission peak wavelength is approximately 450 nm is employed. However, the light emitting element 110 is not limited to this and can be, for example, an ultraviolet (near-ultraviolet) light emitting element whose emission peak wavelength is 390 nm to 420 nm. In a case where the ultraviolet (near-ultraviolet) light emitting element is employed, it is possible to further improve luminous efficiency.

The plurality (i.e., 20 pieces in Embodiment 1) of light emitting elements 110 are provided at predetermined positions, at which an intended amount of light can be obtained, on the front surface of the ceramic insulating film 150. The electrical connection (such as the conductor wiring 160 for anode and the conductor wiring 165 for cathode) of the plurality of light emitting elements 110 is made by the wire bonding with use of wires. Such wires can be, for example, gold wires.

The light reflecting resin frame 130 is formed in a circular shape (circular arc shape) and is made of a silicone resin containing alumina filler. Note that a material of the light reflecting resin frame 130 is not limited to this, provided that the material is an insulating resin having a light reflecting property. Further, a shape of the light reflecting resin frame 130 is not limited to the circular shape (circular arc shape) and can be any shape. The same applies to shapes of the conductor wiring 160 for anode, the conductor wiring 165 for cathode, and the protecting element.

The sealing resin 140 is a sealing resin layer made of a light-transmitting resin. The sealing resin 140 is formed by filling an area surrounded the light reflecting resin frame 130 with the light-transmitting resin, and seals the ceramic insulating film 150, the plurality of light emitting elements 110, the wires, and the like.

Note that the sealing resin 140 can contain a fluorescent substance which (i) is excited by primary light emitted from the plurality of light emitting elements 110 and then (ii) emits light whose wavelength is longer than that of the primary light. A configuration of the fluorescent substance is not particularly limited and can be appropriately selected in accordance with an intended chromaticity of white and the like. For example, as a combination of neutral white and warm white, it is possible to employ a combination of a YAG yellow fluorescent substance and an $(Sr,Ca)AlSiN_3$:Eu red fluorescent substance, or a combination of the YAG yellow fluorescent substance and a $CaAlSiN_3$:Eu red fluorescent substance. Alternatively, as a combination of colors having a high color rendering property, it is possible to employ a combination of the $(Sr,Ca)AlSiN_3$:Eu red fluorescent substance and a $Ca_3(Sc,Mg)_2Si_3O_{12}$:Ce green fluorescent substance, or the like. It is possible to employ a combination of other fluorescent substances. Alternatively, it is possible to employ a configuration in which only the YAG yellow fluorescent substance is used as pseudo-white.

As described above, the light emitting apparatus 30 in accordance with Embodiment 1 includes: a light emitting element 110; electrode sections (anode electrode 170 and cathode electrode 180) for connecting the light emitting apparatus 30 to external wiring (or to an external apparatus); wirings (conductor wiring 160 for anode and conductor wiring 165 for cathode) for connecting the light emitting element 110 to each of the electrode sections (anode electrode 170 and cathode electrode 180); a frame section (light reflecting resin frame 130) which is made of a resin having the light reflecting property and is formed so as to surround an area in which the light emitting element 110 is disposed; and a sealing resin 140 for sealing members (a part of the ceramic insulating film 150, the light emitting element 110, wires, and the like) disposed in the area surrounded by the frame section (light reflecting resin frame 130). The light emitting element 110, the electrode sections, the wirings, the frame section, and the sealing resin 140 are directly provided on a surface of the ceramic insulating film 150.

Next, the following discusses a method for manufacturing the light emitting apparatus 30.

First, a ceramic insulating film 150 having a thickness of 100 μm is formed, by the printing method, on a surface (on one side) of a substrate 100 made of aluminum. Specifically, after a ceramic paint is printed (with a film thickness of 20 μm or more) on the surface (on one side) of the substrate 100, the ceramic paint thus printed is subjected to a drying process and a burning process, and thus the ceramic insulating film 150 is formed. Note that the ceramic paint is preferably a paint that shows the electrical insulating property, the high heat conducting property and the high light reflecting property after the burning process. Further, the ceramic paint contains (i) a solidifying agent for fixing the ceramic paint on the substrate 100, (ii) a resin for making the printing easy, and (iii) a solvent for maintaining a viscosity.

Next, on the ceramic insulating film 150, (i) a conductor wiring 160 for anode, (ii) a conductor wiring 165 for cathode, (iii) an anode electrode 170 and a cathode electrode 180 as respective land sections, (iv) an alignment mark 190, and (v) polarity marks 195 are formed by a screen printing method.

Note that, in Embodiment 1, the conductor wiring 160 for anode, the conductor wiring 165 for cathode, the alignment mark 190, and the polarity marks 195 are formed by silver (Ag) with a thickness of 1.0 μm, nickel (Ni) with a thickness of 2.0 μm, and gold (Au) with a thickness of 0.3 μm. Further, the anode electrode 170 and the cathode electrode 180 as the respective land sections are formed by silver (Ag) with a thickness of 1.0 µm, copper (Cu) with a thickness of 20 µm, nickel (Ni) with a thickness of 2.0 µm, and gold (Au) with a thickness of 0.3 µm.

Then, a plurality of light emitting elements 110 are fixed on the ceramic insulating film 150 with use of a resin paste. Further, the plurality of light emitting elements 110 are connected to each other by wires, and then the conductor wiring 160 is wire-bonded to the plurality of light emitting elements 110 for electrical connection.

Subsequently, on the substrate 100, the conductor wiring 160 for anode, and the conductor wiring 165 for cathode, a light reflecting resin frame 130 are formed so as to surround an area in which the plurality of light emitting elements 110 are provided. A method for forming the light reflecting resin frame 130 is not particularly limited, and a conventionally known method can be employed.

After that, the area surrounded by the light reflecting resin frame 130 is filled with a sealing resin 140 so that the sealing resin 140 seals the ceramic insulating film 150, the light emitting element 110, the wires, and the like in the area.

Note that a reflectance (i.e., reflectance of light having a wavelength of 450 nm) of the ceramic insulating film 150 formed in Embodiment 1 is approximately 4% higher as compared with that of the substrate 100 made of aluminum.

In Embodiment 1, the thickness of the ceramic insulating film 150 is determined in accordance with the reflectance and a dielectric strength. In a case where the ceramic insulating film 150 is excessively thick, a crack may occur. Meanwhile, in a case where the ceramic insulating film 150 is excessively thin, the reflectance and the dielectric strength may not be sufficiently obtained. For these reasons, the thickness of the ceramic insulating film 150 formed on the substrate 100 is preferably 20 µm or more and 130 µm or less, more preferably 50 µm or more and 100 µm or less, in order to (i) secure a reflectance in a visible light region and insulating property between the substrate 100 and the plurality of light emitting elements 110 and (ii) prevent a crack.

Embodiment 2

The following discusses Embodiment 2 of the present invention. Note that, for convenience of explanation, members having functions identical with those of the members described in Embodiment 1 are given the same reference signs, and explanations of such members are omitted.

In Embodiment 1, the ceramic insulating film 150 having the single-layer structure is formed on the substrate 100. Meanwhile, in Embodiment 2, a ceramic insulating film 150 having a multilayer structure including a plurality of ceramic layers is formed on a substrate 100.

Figure 2:
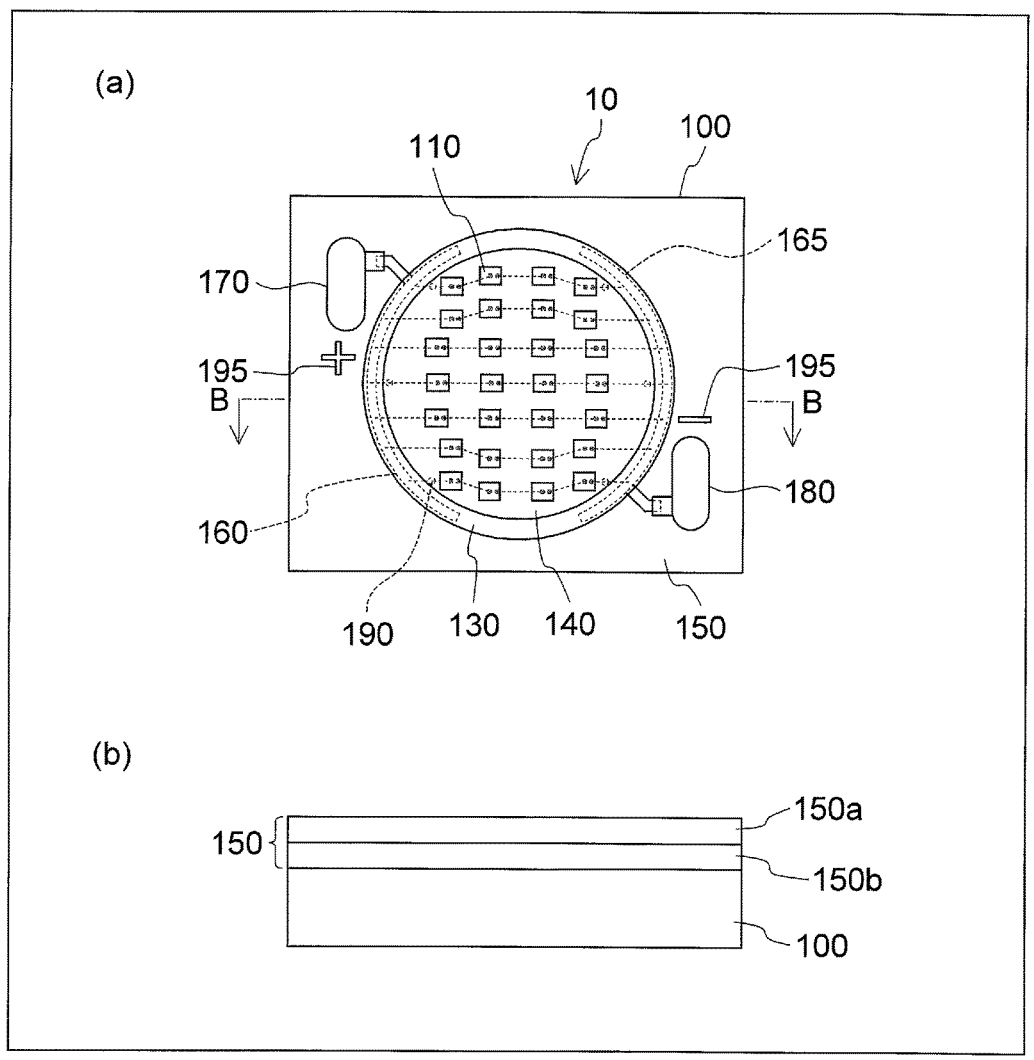
FIG. 2 illustrates a top view and a sectional view of a light emitting apparatus in accordance with Embodiment 2 of the present invention.

(a) of FIG. 2 is a top view illustrating one configuration example of a light emitting apparatus 10 in accordance with Embodiment 2. (b) of FIG. 2 is a cross-sectional view taken from line B-B in (a) of FIG. 2.

As illustrated in FIG. 2, the light emitting apparatus 10 includes a substrate 100, a plurality of light emitting elements (semiconductor light emitting element) 110, a light reflecting resin frame 130, a sealing resin 140, and a ceramic insulating film 150 having a multilayer structure.

Note that the light emitting apparatus 10 is different from the light emitting apparatus 30 of Embodiment 1 in that (i) the ceramic insulating film 150 has the multilayer structure which includes a highly-heat-conductive ceramic layer (first ceramic layer) 150b and a highly-light-reflective ceramic layer (second ceramic layer) 150a, and (ii) an outer shape of the substrate 100 is a quadrangular shape. Other configurations are substantially identical with those of the light emitting apparatus 30.

The substrate 100 is made of a material having a high heat conducting property. The material of the substrate 100 is not limited to a particular one, provided that the material has the high heat conducting property. For example, it is possible to employ a substrate made of metal such as aluminum or copper. In Embodiment 2, the substrate 100 is made of aluminum, as with Embodiment 1.

The ceramic insulating film 150 has the multilayer structure in which the highly-heat-conductive ceramic layer 150b and the highly-light-reflective ceramic layer 150a are stacked on the substrate 100. In Embodiment 2, by forming the multilayer structure by stacking the two different ceramic layers, the ceramic insulating film 150 having the high heat conducting property and the high light reflecting property is provided. Note that it is preferable to form the highly-heat-conductive ceramic layer 150b on the substrate 100 and then form the highly-light-reflective ceramic layer 150a on the highly-heat-conductive ceramic layer 150b. Moreover, at least one of the highly-heat-conductive ceramic layer 150b and the highly-light-reflective ceramic layer 150a preferably has an electrical insulating property.

On a front surface of the ceramic insulating film 150, the plurality of light emitting elements 110, the light reflecting resin frame 130, and the sealing resin 140 are provided. Further, on the front surface of the ceramic insulating film 150, a conductor wiring 160 for anode, a conductor wiring 165 for cathode, an anode electrode 170 and a cathode electrode 180 as respective land sections, an alignment mark 190, polarity marks 195, and the like are directly provided.

Note that, on the front surface of the ceramic insulating film 150, a protecting element (not illustrated) connected in parallel with a circuit, to which the plurality of light emitting elements 110 are connected in series, can further be formed as a resistance element to protect the plurality of light emitting elements 110 from an electrostatic stress. For example, the protecting element can be a printed resistor or a zener diode. In a case where the zener diode is employed as the protecting element, the zener diode is die-bonded on a wiring pattern, and is electrically connected to an intended wire by wire bonding. Even in such a case, the zener diode is connected in parallel with the circuit to which the plurality of light emitting elements 110 are connected in series.

Each of the plurality of light emitting elements 110 is a semiconductor light emitting element such as a LED (Light Emitting Diode). In Embodiment 2, a blue light emitting element whose emission peak wavelength is approximately 450 nm is employed. However, the light emitting element 110 is not limited to this and can be, for example, an ultraviolet (near-ultraviolet) light emitting element whose emission peak wavelength is 390 nm to 420 nm. In a case where the ultraviolet (near-ultraviolet) light emitting element is employed, it is possible to further improve luminous efficiency.

The plurality (i.e., 20 pieces in Embodiment 2) of light emitting elements 110 are provided at predetermined positions, at which an intended amount of light is obtained, on the front surface of the highly-light-reflective ceramic layer 150a. The electrical connection (such as the conductor wiring 160 for anode and the conductor wiring 165 for cathode) of the plurality of light emitting elements 110 is made by the wire bonding with use of wires. Such wires can be, for example, gold wires.

The light reflecting resin frame 130 is formed in a circular shape (circular arc shape) and is made of a silicone resin containing alumina filler. Note that a material of the light reflecting resin frame 130 is not limited to this, provided that the material is an insulating resin having a light reflecting characteristic. Further, a shape of the light reflecting resin frame 130 is not limited to the circular shape (circular arc shape) and can be any shape. The same applies to shapes of the conductor wiring 160 for anode, the conductor wiring 165 for cathode, and the protecting element.

The sealing resin 140 is a sealing resin layer made of a light-transmitting resin. The sealing resin 140 is formed by filling an area surrounded the light reflecting resin frame 130 with the light-transmitting resin, and seals the ceramic insulating film 150, the plurality of light emitting elements 110, the wires, and the like.

Note that the sealing resin 140 can contain a fluorescent substance which (i) is excited by primary light emitted from the plurality of light emitting elements 110 and then (ii) emits light whose wavelength is longer than that of the primary light. A configuration of the fluorescent substance is not particularly limited and can be appropriately selected in accordance with an intended chromaticity of white and the like. For example, as a combination of neutral white and warm white, it is possible to employ a combination of a YAG yellow fluorescent substance and an $(Sr,Ca)AlSiN_3:Eu$ red fluorescent substance, or a combination of the YAG yellow fluorescent substance and a $CaAlSiN_3:Eu$ red fluorescent substance. Alternatively, as a combination of colors having a high color rendering property, it is possible to employ a combination of the $(Sr,Ca)AlSiN_3:Eu$ red fluorescent substance and a $Ca_3(Sc,Mg)_2Si_3O_{12}:Ce$ green fluorescent substance, or the like. It is possible to employ a combination of other fluorescent substances. Alternatively, it is possible to employ a configuration in which only the YAG yellow fluorescent substance is used as pseudo-white.

Figure 3:
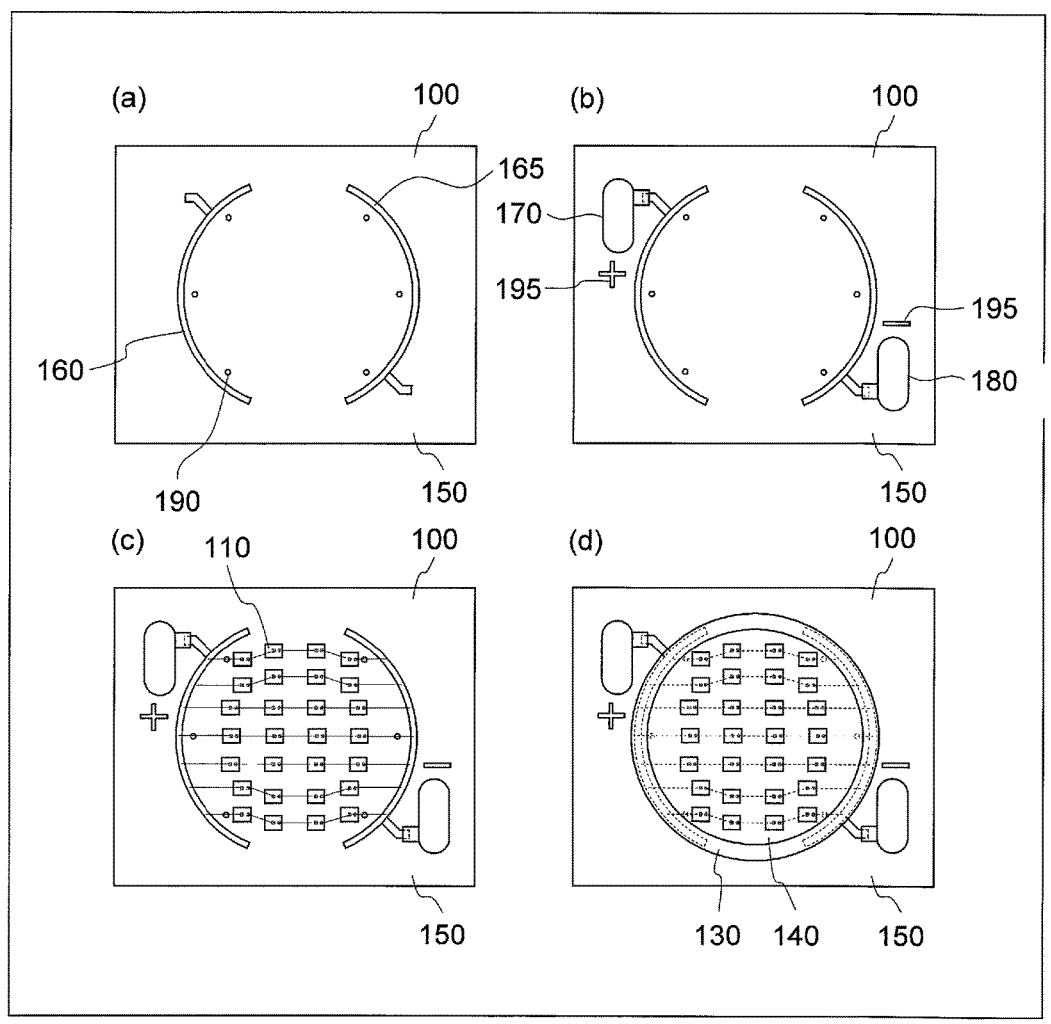
FIG. 3 is an explanatory view for explaining a method for manufacturing the light emitting apparatus in accordance with Embodiment 2 of the present invention.

Next, the following discusses a method for manufacturing the light emitting apparatus 10. FIG. 3 is an explanatory view for explaining steps for manufacturing the light emitting apparatus 10.

First, a high-heat-conductive ceramic layer 150b having a thickness of 50 μm is formed, by the printing method, on a surface (on one side) of a substrate 100 made of aluminum. Specifically, after a ceramic paint which is to become the high-heat-conductive ceramic layer 150b is printed (with a film thickness of 20 μm or more) on the surface (on one side) of the substrate 100, the ceramic paint thus printed is subjected to a drying process and a burning process, and thus the high-heat-conductive ceramic layer 150b is formed. Note that the ceramic paint is a paint that shows the high heat conducting property after the burning process. Further, the ceramic paint contains (i) a solidifying agent for fixing the ceramic paint on the substrate 100, (ii) a resin for making the printing easy, and (iii) a solvent for maintaining a viscosity.

Next, the highly-light-reflective ceramic layer 150a having a thickness of 50 μm is formed, by the printing method, on the highly-heat-conductive ceramic layer 150b. Specifically, after a ceramic paint which is to be the highly-light-reflective ceramic layer 150a is printed (with a film thickness of 20 μm or more) on the highly-heat-conductive ceramic layer 150b, the ceramic paint thus printed is subjected to a drying process and a burning process, and thus the highly-light-reflective ceramic layer 150a is formed. Note that the ceramic paint is a paint that shows the high light reflecting property after the burning process. Further, the ceramic paint contains (i) a solidifying agent for fixing the ceramic paint on the substrate 100, (ii) a resin for making the printing easy, and (iii) a solvent for maintaining a viscosity.

Next, on the ceramic insulating film 150 (highly-light-reflective ceramic layer 150a), (i) a conductor wiring 160 for anode, (ii) a conductor wiring 165 for cathode, and (iii) an alignment mark 190 are formed by a screen printing method (see (a) of FIG. 3). After that, an anode electrode 170 and a cathode electrode 180 as respective land sections, and polarity marks 195 are formed by the screen printing method (see (b) of FIG. 3).

Note that, in Embodiment 2, the conductor wiring 160 for anode, the conductor wiring 165 for cathode, the alignment mark 190, and the polarity marks 195 are formed by silver (Ag) with a thickness of 1.0 μm, nickel (Ni) with a thickness of 2.0 μm, and gold (Au) with a thickness of 0.3 μm. Further, the anode electrode 170 and the cathode electrode 180 as the respective land sections are formed by silver (Ag) with a thickness of 1.0 μm, copper (Cu) with a thickness of 20 μm, nickel (Ni) with a thickness of 2.0 μm, and gold (Au) with a thickness of 0.3 μm.

Then, a plurality of light emitting elements 110 are fixed on the ceramic insulating film 150 (highly-light-reflective ceramic layer 150a) with use of a resin paste. Further, the plurality of light emitting elements 110 are connected to each other by wires, and then the conductor wirings 160 and 165 are wire-bonded to the plurality of light emitting elements 110 for electrical connection (see (c) of FIG. 3).

Subsequently, on the substrate 100, the conductor wiring 160 for anode, and the conductor wiring 165 for cathode, a light reflecting resin frame 130 are formed so as to surround an area in which the plurality of light emitting elements 110 are provided. A method for forming the light reflecting resin frame 130 is not particularly limited, and a conventionally known method can be employed.

After that, the area surrounded by the light reflecting resin frame 130 is filled with a sealing resin 140 so that the sealing resin 140 seals the ceramic insulating film 150, the light emitting element 110, the wires, and the like in the area (see (d) of FIG. 3).

Note that a reflectance (i.e., reflectance of light having a wavelength of 450 nm) of the ceramic insulating film 150 (highly-light-reflective ceramic layer 150a) formed in Embodiment 2 is approximately 4% higher as compared with that of the substrate 100 made of aluminum.

Note that, in a case where the highly-light-reflective ceramic layer 150a and the highly-heat-conductive ceramic layer 150b are excessively thick, a crack may occur. Meanwhile, in a case where the highly-light-reflective ceramic layer 150a and the highly-heat-conductive ceramic layer 150b are excessively thin, a reflection characteristic, a heat conducting property, and a dielectric strength may not be sufficiently obtained. For these reasons, in Embodiment 2, a thickness of each of the highly-light-reflective ceramic layer 150a and the highly-heat-conductive ceramic layer 150b is set to be 50 μm by taking into consideration (i) characteristics (i.e., high light reflecting property, high heat conducting property, and dielectric strength) demanded for the highly-light-reflective ceramic layer 150a and the high heat conductive ceramic layer 150b and (ii) prevention of a crack. Note that, in a case where one of the high light reflecting property and the high heat conducting property is prioritized, one of the layers 150a and 150 which one has the prioritized property can be formed to be thicker. Note, however, that, in order to prevent the crack and to achieve the characteristics demanded for the highly-light-reflective ceramic layer 150a and the highly-heat-conductive ceramic layer 150b, the thickness of each of the layers 150a and 150 is set to preferably 10 μm or more and 65 μm or less, more preferably 25 μm or more and 50 μm or less. Moreover, in order to surely prevent the crack, it is preferable to set a total thickness of the highly-light-reflective ceramic layer 150a and the highly-heat-conductive ceramic layer 150b to be 100 μm or more and 130 μm or less.

Embodiment 3

The following discusses Embodiment 3 of the present invention. Note that, for convenience of explanation, members having functions identical with those of the members described in Embodiment 1 are given the same reference signs, and explanations of such members are omitted.

In Embodiment 2, the ceramic insulating film 150 having the multilayer structure, which includes the highly-heat-conductive ceramic layer 150b and the highly-light-reflective ceramic layer 150a, is formed on the substrate 100. Meanwhile, in Embodiment 3, the following discusses a multilayer structure including (i) a silver (Ag) layer for achieving a light reflecting property and (ii) a highly-heat-conductive ceramic layer.

Figure 4:
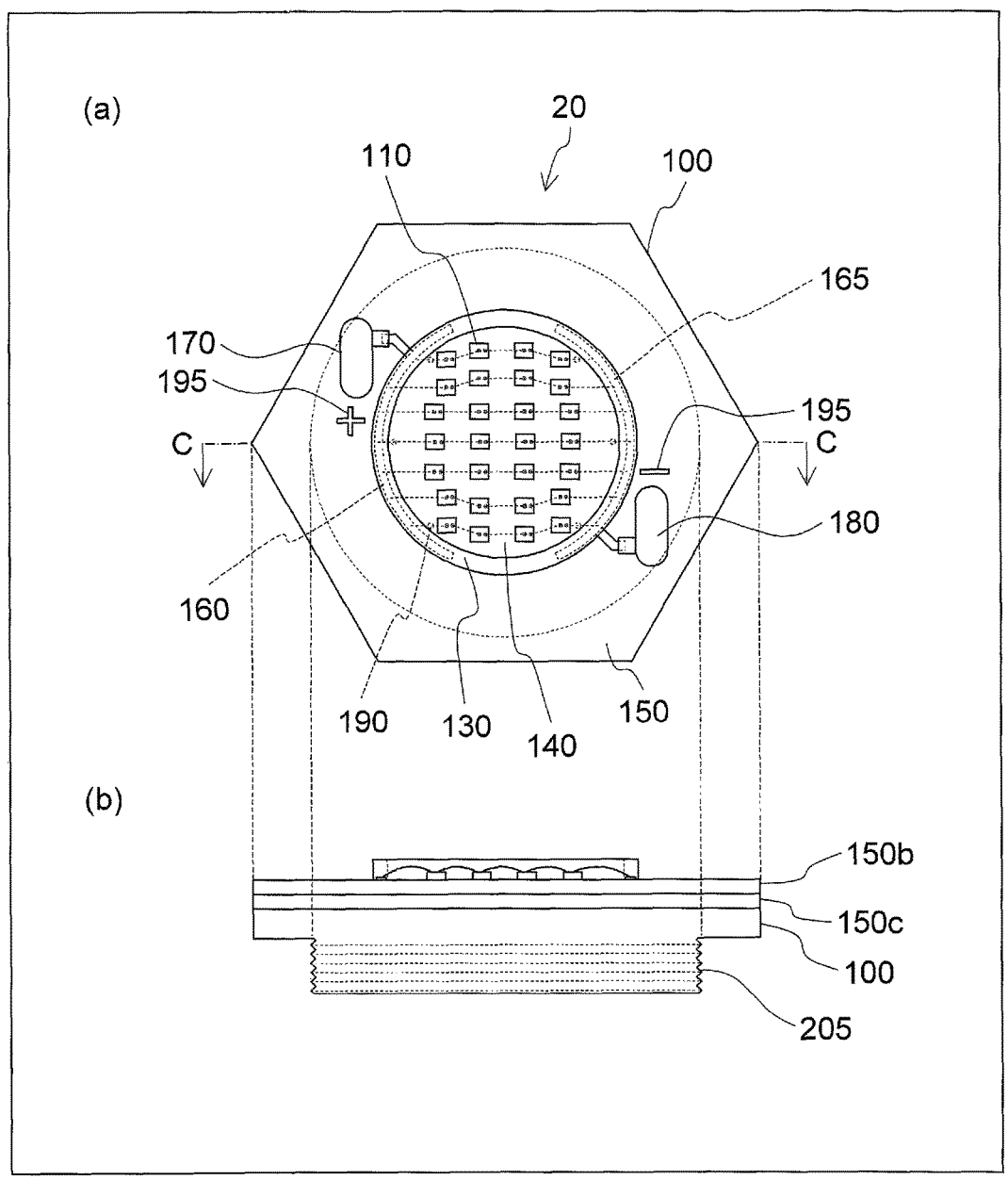
FIG. 4 illustrates a top view and a sectional view of a light emitting apparatus in accordance with Embodiment 3 of the present invention.

(a) of FIG. 4 is a top view illustrating one configuration example of a light emitting apparatus 20 in accordance with Embodiment 3. (b) of FIG. 4 is a cross-sectional view taken from line C-C in (a) of FIG. 4.

As illustrated in FIG. 4, the light emitting apparatus 20 includes a substrate 100, a plurality of light emitting elements (semiconductor light emitting element) 110, a light reflecting resin frame 130, a sealing resin 140, a silver (Ag) layer 150c, and a highly-heat-conductive ceramic insulating film 150b.

Note that the light emitting apparatus 20 is different from Embodiment 2 in that (i) the highly-heat-conductive ceramic layer (highly-heat-radiative ceramic layer) 150b (ceramic insulating film 150) is formed on a front surface of the silver (Ag) layer 150c having a high light reflecting property, (ii) a male screw (screw member) 205 for fixing the light emitting apparatus 20 on a heat sink (not illustrated) is provided on a back surface side of the substrate 100, and (iii) an outer shape of the substrate 100 is a hexagonal shape. Other configurations are substantially identical with those of Embodiment 2.

The multilayer structure of Embodiment 3 includes (i) the silver (Ag) layer 150c formed on the substrate 100 by plating and (ii) the highly-heat-conductive ceramic layer 150b formed on the silver layer 150c by a printing method. In Embodiment 3, the highly-heat-conductive ceramic layer 150b is made of a ceramic material having an electrical insulating property and a property (light-transmitting property) of not absorbing light that has been emitted from the plurality of light emitting elements 110.

The above configuration allows the silver layer 150c to reflect light that has leaked from the plurality of light emitting elements 110 toward the substrate 100. Further, it is possible to radiate heat, which has generated by the plurality of light emitting elements 110, to the substrate 100 via the highly-heat-conductive ceramic layer 150b and the silver layer 150c. As such, in Embodiment 3, it is possible to achieve the high heat conducting property and the high light reflecting property by employing the multilayer structure in which the silver layer 150c and the highly-heat-conductive ceramic layer 150b are stacked.

It is known that, in a case where a surface of silver is not covered, a reflectance of silver is extremely decreased due to blackening, sulfurization, discoloration, and the like. With regard to this, in Embodiment 3, it is possible to prevent decrease in reflectance of the silver layer 150c because the front surface of the silver layer 150c is covered with the highly-heat-conductive ceramic layer 150b.

Further, in the light emitting apparatus 20, the male screw 205 is provided on part of the back surface of the substrate 100 for attaching the light emitting apparatus 20 to the heat sink (not illustrated). This makes it possible to tightly fix the light emitting apparatus 20 on the heat sink. Note that the male screw 205 can be integral with the substrate 100 or can be attached to the substrate 100 by welding or the like. The material of the male screw 205 is not particularly limited but, for enhancing a property of radiating heat to the heat sink, it is preferable to employ a material having a high heat conducting property.

Furthermore, in the light emitting apparatus 20, the outer shape of the substrate 100 is the hexagonal shape. This makes it possible to tightly fix the light emitting apparatus 20 on the heat sink with the male screw 205 by tightening the substrate 100 with use of a tool such as a wrench or a spanner. The outer shape of the substrate 100 is not limited to the hexagonal shape and can be a polygonal shape (such as a triangular shape, a quadrangular shape, a pentagonal shape, or an octagonal shape), a circular shape, an elliptical shape, or the like, or other shape. Note that at least part of the outer shape of the substrate 100 preferably has a straight line portion so that the light emitting apparatus 20 can be easily attached to the heat sink with use of the male screw 205.

In Embodiment 3, the silver layer 150c is provided as a light reflecting layer. Note, however, that the light reflecting layer is not limited to this and, for example, any metal layer which is not silver and has the light reflecting property can be used as the light reflecting layer.

As described above, a light emitting apparatus in accordance with one aspect of the present invention includes: a substrate; a light emitting element disposed on the substrate; and a ceramic insulating film which has been formed by applying a ceramic paint to the substrate and has a heat conducting property and a light reflecting property, the light emitting element being disposed on the ceramic insulating film.

The above configuration makes it possible to achieve the light emitting apparatus in which the insulating layer excellent in heat conducting property and in light reflecting property is provided on the substrate on which the light emitting element is provided. In a case where a high-output light emitting apparatus is prepared, it is necessary to (i) provide a large number of light emitting elements on a substrate and accordingly (ii) enlarge an area of the substrate. With regard to this, the configuration of the present invention makes it possible to easily provide the light emitting apparatus having the high reflectance and the high heat-radiating property by forming the ceramic insulating film on the substrate which is large in area.

It is possible to employ a configuration in which the substrate is made of a metal material.

It is possible to employ a configuration in which the ceramic insulating film has a multilayer structure.

It is possible to employ a configuration in which a plurality of layers constituting the ceramic insulating film include (i) a first ceramic layer which makes contact with the substrate and has the heat conducting property and (ii) a second ceramic layer which is located farthest from the substrate and has the light reflecting property.

It is possible to employ a configuration in which a thickness of the first ceramic layer is 10 μm or more and 65 μm or less.

It is possible to employ a configuration in which a thickness of the second ceramic layer is 10 μm or more and 65 μm or less.

It is possible to employ a configuration in which the light emitting apparatus includes a metal layer which has been formed on a surface of the substrate and has the light reflecting property, and the ceramic insulating film includes a ceramic layer which has been formed on the metal layer and has a light-transmitting property and the heat conducting property.

It is possible to employ a configuration in which the ceramic insulating film is provided on a surface of the substrate on one side of the substrate; and a screw section for attaching the light emitting apparatus to another apparatus is provided on a surface of the substrate on the other side of the substrate.

It is possible to employ a configuration in which an outer shape of the substrate is a polygonal shape or a shape having at least one straight line portion when the substrate is viewed from a normal direction with respect to a substrate surface.

It is possible to employ a configuration in which the light emitting apparatus further includes: an electrode section for connecting the light emitting apparatus to external wiring or an external apparatus; a wiring for connecting the light emitting element to the electrode section; a frame section which is made of a resin having the light reflecting property and is formed so as to surround an area in which the light emitting element is disposed; and a sealing resin for sealing members disposed in the area surrounded by the frame section, the light emitting element, the electrode section, the wiring, the frame section, and the sealing resin being provided on a surface of the ceramic insulating film.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention can be applied to a light emitting apparatus including a light emitting element provided on a substrate.

REFERENCE SIGNS LIST 10, 20, 30 Light Emitting Apparatus
100 Substrate
110 Light Emitting Element
130 Light Reflecting Resin Frame
140 Sealing Resin
150 Ceramic Insulating Film
150a Highly-Light-Reflective Ceramic Layer (Second Ceramic Layer)
150b Highly-Heat-Conductive Ceramic Layer (First Ceramic Layer)
150c Silver Layer (Metal Layer)
160 Conductor Wiring For Anode (Wiring)
165 Conductor Wiring for Cathode (Wiring)
179 Anode Electrode (Electrode Section)
180 Cathode Electrode (Electrode section)
205 Male Screw (Screw Section)

The invention claimed is:

1. A light emitting apparatus comprising:
a substrate including a metal material;
a first ceramic layer including a ceramic paint on a surface of one side of the substrate;
a second ceramic layer including a ceramic paint on the first ceramic layer;
a light emitting element on the second ceramic layer;
a frame including a resin having a light reflecting property on the second ceramic layer and surrounding a region in which the light emitting element is provided;
a sealing resin on the second ceramic layer, the sealing resin sealing members provided in the region surrounded by the frame;
an electrode outside the frame and on the second ceramic layer, the electrode connecting the light emitting apparatus to an external wiring or an external device; and
a wiring on the second ceramic layer, the wiring electrically connecting the light emitting element to the electrode, wherein
the first ceramic layer has a heat conductivity and an electric insulating property,
the second ceramic layer has a light reflecting property and an electric insulating property,
each of the first ceramic layer and the second ceramic layer is defined by only one single monolithic layer,
the first ceramic layer and the second ceramic layer differ from each other in thickness,
in a case where the heat conductivity is given priority over the light reflecting property, the first ceramic layer is thicker than the second ceramic layer, and
in a case where the light reflecting property is given priority over the heat conductivity, the second ceramic layer is thicker than the first ceramic layer.

2. The light emitting apparatus as set forth in claim 1, wherein:
the first ceramic layer and the second ceramic layer are provided on the surface of the substrate on the one side of the substrate; and
a screw section that attaches said light emitting apparatus to another apparatus is provided on a surface of the substrate on the other side of the substrate.

3. The light emitting apparatus as set forth in claim 1, wherein an outer shape of the substrate is a polygonal shape or a shape including at least one straight line portion when the substrate is viewed from a normal direction with respect to a substrate surface.

4. The light emitting apparatus as set forth in claim 1, wherein a thickness of the first ceramic layer is 10 μm or more and 65 μm or less.

5. The light emitting apparatus as set forth in claim 1, wherein a thickness of the second ceramic layer is 10 μm or more and 65 μm or less.

* * * * *